United States Patent
Baldus

(10) Patent No.: US 9,673,079 B2
(45) Date of Patent: Jun. 6, 2017

(54) CLAMP WITH ELECTRODE CARRIER DISK

(71) Applicant: Berliner Glas KGaA Herbert Kubatz GmbH & Co., Berlin (DE)

(72) Inventor: Oliver Baldus, Berlin (DE)

(73) Assignee: Berliner Glas KGaA Herbert Kubatz GmbH & Co., Berlin (DE)

( * ) Notice: Subject to any disclaimer, the term of this patent is extended or adjusted under 35 U.S.C. 154(b) by 71 days.

(21) Appl. No.: 14/724,083

(22) Filed: May 28, 2015

(65) Prior Publication Data

US 2015/0348815 A1    Dec. 3, 2015

(30) Foreign Application Priority Data

May 28, 2014    (DE) .................. 10 2014 008 029

(51) Int. Cl.
*H01L 21/683* (2006.01)
*H02N 13/00* (2006.01)

(52) U.S. Cl.
CPC ......... *H01L 21/6833* (2013.01); *H02N 13/00* (2013.01); *Y10T 29/49156* (2015.01)

(58) Field of Classification Search
CPC ............................ H01L 21/6833; H02N 13/00
USPC ........................................................ 361/234
See application file for complete search history.

(56) References Cited

U.S. PATENT DOCUMENTS

| | | |
|---|---|---|
| 4,502,094 A | 2/1985 | Lewin et al. |
| 5,535,090 A | 7/1996 | Sherman |
| 8,476,167 B2 | 7/2013 | Van Mierlo et al. |
| 8,902,562 B2 | 12/2014 | Helmus et al. |
| 2005/0181617 A1 | 8/2005 | Bosch |
| 2006/0016554 A1 | 1/2006 | Ahn |
| 2008/0123241 A1* | 5/2008 | Bollmann ........... H01L 21/6833 361/234 |
| 2009/0308538 A1 | 12/2009 | Yonekura et al. |
| 2009/0310274 A1 | 12/2009 | Koyama et al. |

(Continued)

FOREIGN PATENT DOCUMENTS

| | | |
|---|---|---|
| EP | 1521120 A2 | 4/2005 |
| EP | 2793083 A1 | 10/2014 |

(Continued)

OTHER PUBLICATIONS

English abstract for JP 2007027494 A (2007).

(Continued)

*Primary Examiner* — Scott Bauer
(74) *Attorney, Agent, or Firm* — Caesar Rivise, PC

(57) ABSTRACT

A holding apparatus (100) designed to electrostatically hold a component (1), e.g., a silicon wafer, includes a base body (10) produced from at least one plate (11, 12), a plurality of projecting burls (14) arranged on an upper side (13) of the base body (10) and form a support for component (1), and an electrode device (20) having a plurality of electrodes (21) arranged on the upper side (13) in gaps between burls (14), wherein the electrode device (20) comprises a silicon carrier disk (22) having a plurality of holes (23), and the carrier disk (22) is arranged on the upper side (13) in such a manner that the burls (14) project through the holes (23) and are spaced apart from the carrier disk (22), and wherein the electrodes (21) are arranged on disk portions between the holes (23). A method for producing the holding apparatus (100) is also described.

13 Claims, 1 Drawing Sheet

(56) References Cited

U.S. PATENT DOCUMENTS

| | | | |
|---|---|---|---|
| 2010/0039747 A1 | 2/2010 | Sansoni et al. | |
| 2010/0206454 A1 | 8/2010 | Maeda et al. | |
| 2012/0274920 A1* | 11/2012 | Bex | G03F 7/70708 355/72 |
| 2012/0299253 A1 | 11/2012 | Kosakai et al. | |
| 2013/0033690 A1 | 2/2013 | Helmus et al. | |
| 2013/0094009 A1* | 4/2013 | Lafarre | G03F 7/70691 355/72 |
| 2013/0148253 A1 | 6/2013 | Komatsu et al. | |
| 2013/0189802 A1* | 7/2013 | Tromp | G03F 7/707 438/14 |
| 2013/0308116 A1 | 11/2013 | Helmus et al. | |
| 2014/0008880 A1 | 1/2014 | Miura et al. | |
| 2014/0042716 A1 | 2/2014 | Miura et al. | |
| 2014/0376148 A1 | 12/2014 | Sasaki et al. | |

FOREIGN PATENT DOCUMENTS

| | | |
|---|---|---|
| JP | 2007027494 A | 2/2007 |
| JP | 2007-027494 A | 12/2015 |
| WO | 2013118781 A1 | 8/2013 |
| WO | 2013160026 A2 | 10/2013 |
| WO | WO 2013/118781 A1 | 12/2015 |

OTHER PUBLICATIONS

U.S. Appl. No. 14/723,608, filed May 28, 2015.
U.S. Appl. No. 14/723,635, filed May 28, 2015.
U.S. Appl. No. 14/724,215, filed May 28, 2015.

* cited by examiner

CLAMP WITH ELECTRODE CARRIER DISK

BACKGROUND OF THE INVENTION

The invention relates to a holding apparatus designed to electrostatically hold a component, in particular a silicon wafer. The invention relates also to a method for producing the holding apparatus. Applications of the invention are in the provision of devices or tools for holding components by means of electrostatic forces, in particular for holding semiconductor components, for example silicon wafers.

Holding apparatuses for holding components electrostatically, which are also referred to as electrostatic holding apparatuses, electrostatic clamping apparatuses, electrostatic clamps, ESCs or electrostatic chucks, are known in general. An important application of electrostatic holding apparatuses is in holding silicon wafers in lithographic semiconductor processing, for example in chip production, in which the particular advantages of electrostatic holding, such as the ease of switching of electrostatic holding or clamping forces, a high positioning accuracy and the reliable fixing of silicon wafers, are exploited.

Typically, an electrostatic holding apparatus has a structure having a plurality of plate-type or layer-type elements that perform differing functions (see e.g. U.S. Pat. No. 4,502,094 or US 2013/0308116 A1). At least one plate-type element is equipped with an electrode device, by means of which the electrostatic holding forces are generated. According to US 2013/0308116 A1, the electrode device comprises a plurality of electrodes which are embedded in a multilayer plate-type element. At least one further plate-type element is made of a mechanically stiff ceramic for performing a carrying and cooling function. Furthermore, an electrostatic holding apparatus typically has on its upper side a plurality of projecting upper burls which form a support surface for the silicon wafer.

The conventional electrostatic holding apparatus, for example according to US 2013/0308116 A1, has the following disadvantages. The production of the holding apparatus is complex because of the embedding of the electrodes into a plate-type element. The connecting lines of the electrodes which are required for receiving a clamping voltage must likewise be embedded into the first plate. As a result, the electrostatic holding forces can be distributed inhomogeneously along the support surface and may tend to change over time (aging). The embedded electrodes are at a relatively large distance from the component to be held and therefore require a high clamping voltage. Furthermore, the conventional electrostatic holding apparatus is sensitive to particles. Particles which are approximately as large as or larger than the gap between the component to be held and the underlying dielectric interfere with the planarity considerably and can damage the dielectric. The holding force (clamping pressure) is reduced by the gap caused by particles. Further disadvantages arise because, in most electrostatic holders, the burls are made of a dielectric material. As a result, the heat transfer from the wafer into the temperature-adjusted body of the holder is impaired.

A further problem in the production of the conventional holding apparatus is that the plate-type elements have to be produced in succession in terms of time, the mechanically stiff plate-type element being produced first and the plate-type element with the embedded electrodes then being composed. The production time is lengthened as a result, and flexible matching of the holding apparatus to the requirements of a specific application is made more difficult.

The mentioned disadvantages occur not only in the case of electrostatic holding apparatuses for silicon wafers, but also in the case of holding apparatuses having embedded electrodes for other components, such as, for example, for glass plates having a transparent electrode (ITO), which form AMLCD substrates.

OBJECTS OF THE INVENTION

The objective of the invention is to provide an improved electrostatic holding apparatus which avoids disadvantages of conventional techniques. The holding apparatus is to permit in particular simplified production, a shortened production time, a reduction of the clamping voltage without impairment of the holding forces, a reduced sensitivity to particles and/or a more homogeneous distribution of electrostatic holding forces. A further objective of the invention is to provide an improved method for producing the electrostatic holding apparatus which avoids disadvantages of conventional techniques and is distinguished in particular by a simplified procedure.

These objectives are achieved, respectively, by a holding apparatus and by a method of the invention.

DESCRIPTION OF THE INVENTION

According to a first general aspect of the invention there is provided a holding apparatus for electrostatically holding a component, in particular a silicon wafer, having a plate-type base body and an electrode device. The holding apparatus is equipped with a plurality of projecting burls (also referred to as carrier elements) which are arranged on an upper side of the base body and form a support for the component. The electrode device comprises a plurality of electrodes which are arranged on the upper side of the base body in gaps between the burls. According to the invention, the electrode device comprises a carrier disk which is made of silicon and comprises a plurality of holes corresponding to the arrangement of the burls. The carrier disk is arranged on the upper side of the base body in such a manner that the burls project through the holes and are spaced apart from the carrier disk. The electrodes are arranged on disk portions between the holes.

According to a second general aspect of the invention there is provided a method for producing a holding apparatus for electrostatically holding a component, in particular a silicon wafer, comprising a base body, comprising at least one plate and a plurality of projecting burls, and an electrode device having a plurality of electrodes. According to the invention, the electrode device is produced in such a manner that a carrier disk of silicon having a plurality of holes is produced and the electrodes are formed on disk portions between the holes. According to the invention, the carrier disk is then placed on the upper side of the base body so that the burls project through the holes of the carrier disk and the electrodes are arranged on the upper side of the base body in gaps between the burls. The holes of the carrier disk are formed and arranged such that the burls are spaced apart from the carrier disk. According to the invention, the carrier disk and the base body are then connected together.

The use of the silicon carrier disk for producing the electrode device offers a number of advantages. Firstly, the carrier disk made of silicon has a high inherent stability, so that it can be produced separately from the base body and can be provided with the electrodes. The carrier disk is stable even when it has a small thickness in the sub-mm range, in particular in the case of a thickness of less than 700 μm, particularly preferably below 300 μm. Furthermore, the distance of the electrodes from the component positioned on the burls can be adjusted by means of the thickness of the carrier disk. The carrier disk with the electrodes, on the one hand, and the base body, on the other hand, can be produced in parallel in terms of time as separate modules, so that the production time of the holding apparatus is shortened in comparison with the conventional technique. Furthermore, the holding apparatus can more easily be matched to requirements of a specific application, for example by modifying the carrier disk with the electrodes without changing the base body.

A further advantage of the invention is that methods of silicon processing such as are known per se from semiconductor technology can be used in the structuring of the carrier disk and/or the provision of the electrodes, for example the deposition of layer-type electrodes. The silicon carrier disk is preferably a silicon wafer known per se, in particular of crystalline silicon, which is provided by methods of semiconductor technology with the holes passing through the carrier disk in the thickness direction thereof and with the electrodes on disk portions between the holes.

According to a preferred embodiment of the invention, the electrode device is equipped with conductor strips which are arranged on the carrier disk. The conductor strips are formed in layer form on the surface of the carrier disk, and they connect the electrodes to a voltage source for generating an electrostatic clamping voltage. Advantageously, the conductor strips, like the electrodes, can be formed on the silicon carrier disk by structuring and/or layer deposition.

The electrostatic clamping voltage is generated between the electrodes and the component to be held, the component being connected to a separate voltage connection or, when burls are made of an electrically conductive material, being connected to the voltage source by being placed on the burls. Advantageously, it is therefore sufficient for each electrode to be equipped with precisely one conductor strip.

Advantageously, there are various possibilities for connecting the electrodes to the voltage source via the conductor strips. For example, all the electrodes can be connected in parallel. This variant of the invention offers the advantage that the arrangement of the conductor strips is simplified. Alternatively, at least one of the electrodes can be connected to the voltage source via a conductor strip which is electrically separate from the other conductor strips and is configured to apply a specific clamping voltage to the associated electrode. Advantageously, this allows the clamping voltage to be varied along the surface of the holding apparatus, for example in order to compensate for local variations in the electrostatic holding force. For example, each of the electrodes can be connected to the voltage source via an associated conductor strip, which is separate from all the other conductor strips, and receive a specific clamping voltage. Alternatively, electrodes can be equipped in groups with electrically connected conductor strips, so that the electrodes of one group of electrodes can receive a common specific clamping voltage. This advantageously allows the electrostatic holding force to be optimized along the surface of the holding apparatus, and the planarity of the component that is being held, for example at the outer edge of the holding apparatus, can be improved. Furthermore, applying specific clamping voltages to individual or groups of electrodes allows the clamping operation to be controlled purposively, for example in the case of removal of a held component.

According to a further preferred embodiment of the invention, the base body is composed of a first plate and a second plate, wherein the first plate is made of an electrically conductive, Si-based ceramic, such as, for example, SiSiC or SSiC, and the second plate is made of an electrically insulating ceramic, for example $Si_3N_4$ or SiC ceramic, or from borosilicate glass. Advantageously, the first plate can be used for the contacting of the component to be held, for example for connecting the component to be held with ground potential. Furthermore, the second plate advantageously has a high mechanical stiffness and stability. Preferably, the second plate has on its side facing the upper side of the base body a recess into which the first plate is set. The first plate is enclosed by the second plate apart from on its upper side. Advantageously, the first plate is thereby electrically insulated and protected.

According to further advantageous embodiments of the invention, the electrode device can be equipped with at least one insulating layer of a dielectric material. The use of coatings for electrical insulation between the electrode and the wafer advantageously allows the distance between the electrode and the wafer to be reduced locally, i.e. above the electrodes, as a result of which the clamping pressure increases significantly, or the operating voltage can be reduced. According to a first variant of the invention, the silicon carrier disk can have on its surface a closed first insulating layer on which the electrodes and preferably also the conductor strips are arranged. The first insulating layer can preferably be produced by thermal oxidation. The first insulating layer is particularly preferably formed by the oxide of the silicon material of the carrier disk. The silicon carrier disk preferably has an oxide layer ($SiO_2$) which has a thickness of 1 μm, for example. Alternatively, the first insulating layer can be produced by deposition of silicon nitride or silicon oxide by a PECVD process. The first insulating layer offers the advantage that the electrodes are electrically insulated with respect to the carrier disk.

According to a second variant there can be provided, alternatively or in addition, a second insulating layer which covers the carrier disk including the electrodes. The second insulating layer can be produced, for example, from a SiN-based dielectric having a relative dielectric constant in the range of from 4 to 10, such a low dielectric constant having advantages for rapid switching of the holding apparatus. Alternatively, the second insulating layer can be made of, for example, $Ta_2O_5$, $Al_2O_3$, $ZrO_2$ or $HfO_2$ having a relative dielectric constant of from 10 to 100 or from a piezo-ceramic material having a relative dielectric constant above 100. In this case, although the switching times are reduced, the clamping force increases correspondingly as a result of the high permittivity. The operating voltage can thus be reduced if the clamping force is not to increase further.

According to a further preferred embodiment of the invention, the electrodes on the surface of the silicon carrier disk are made of polysilicon or titanium nitride. Electrodes of polysilicon, preferably having a thickness in the range of from 50 nm to 1000 nm, have the advantage of a small difference in the work function relative to the adjacent crystalline silicon, so that undesired charging effects are avoided. On the other hand, titanium nitride electrodes, which are preferably likewise produced with a thickness in the mentioned thickness range, have the advantage of forming a particularly effective diffusion barrier and reducing electromigration and chemical conversion in adjacent insulating layers. The latter has a positive effect on the longevity of the holding apparatus.

Advantageously, there are various possibilities for configuring the burls in dependence on the requirements of a specific application. According to a first variant, the burls are connected electrically conductively to the first plate of the base body. Because the value of the electrical holding force is distance-dependent, this preferred embodiment of the invention permits contacting of the component, for example connection of the component with ground potential, via the burls. According to a further variant, the burls are particularly preferably made of the same electrically conductive, Si-based ceramic as the first plate. For example, the burls can be integrally connected to the first plate. The burls can be produced by structuring of the first plate, for example by means of etching, so that the production of the holding apparatus is simplified further. It is particularly advantageous to use, for example, SiC or SiSiC burls.

According to a further, particularly preferred embodiment of the invention, the holding apparatus is equipped with a second electrode device (lower electrode device) on the side opposite the upper side, i.e. on an underside of the base body. Preferably, the underside of the holding apparatus is also equipped with projecting burls (lower burls, lower carrier elements), which form a support surface (carrier surface) for the holding apparatus on the carrier platform.

The lower burls are arranged on the underside of the base body distributed over the extent of the holding apparatus with mutual gaps, so that unwanted particles can be received in the gaps between the lower burls. This advantageously allows the holding apparatus to be fixed temporarily to a stationary carrier platform under the action of electrostatic holding forces. The second electrode device is advantageously formed by a further silicon carrier disk which has the same structure as the silicon carrier disk on the upper side of the holding apparatus.

According to a further advantageous embodiment of the invention, the holding apparatus is equipped with at least one temperature adjustment device, in particular a resistance heating system, a Peltier cooling system and/or at least one temperature adjustment medium line. The at least one temperature adjustment means is embedded in the base body, preferably between the first and second plates or in the third plate. The at least one temperature adjustment medium line is designed to adjust the temperature of the holding apparatus by means of a flowing temperature adjustment medium, in particular cooling medium or heating medium.

BRIEF DESCRIPTION OF THE DRAWINGS

Further details and advantages of the invention will be described in the following with reference to the accompanying drawings, in which.

Preferred embodiments of the electrostatic holding apparatus according to the invention and of the method for the production thereof are described in the following with reference, by way of example, to features of an electrostatic holding apparatus for silicon wafers which is shown schematically and not to scale. It is emphasized that the implementation of the invention is not limited to holding apparatuses for silicon wafers. Rather, other applications of the holding apparatus are also conceivable, such as, for example, for holding glass plates carrying electrodes, in which cases the form of the upper and/or lower support or carrier surfaces, their structuring, the form of the burls, the materials and the dimensions are matched to the specific requirements. Furthermore, it is emphasized that the implementation of the invention is not limited to the variants, shown by way of example, of the holding apparatus having a first and a second plate of the base body, each of which is produced in one piece. Alternatively, at least one of the plates can be produced in multilayer form from a plurality of partial plates. Finally, the figures do not show illustrations of holding apparatuses that are to scale, but illustrate in particular the provision of the carrier disk for receiving the electrodes.

The structure of the base body of the holding apparatus can be chosen as is known per se from conventional holding apparatuses. Further details of the specific form of the holding apparatus, for example as a monopolar or bipolar holding apparatus, the temperature adjustment and the application of voltages in order to generate the electrostatic holding forces will not be described, as far as they are known from conventional holding apparatuses.

Finally, it is emphasized that the implementation of the invention in practice is not limited to the embodiment illustrated, in which the projecting upper burls are provided only on the upper side of the holding apparatus for receiving the component to be held. The implementation of the invention is correspondingly possible with projecting lower burls also on the underside for positioning of the holding apparatus on a carrier platform, wherein a silicon carrier disk having electrodes for generating electrostatic holding forces preferably also being provided on the underside of the holding apparatus in the case of this variant which is not shown in the figures.

Figure 1:
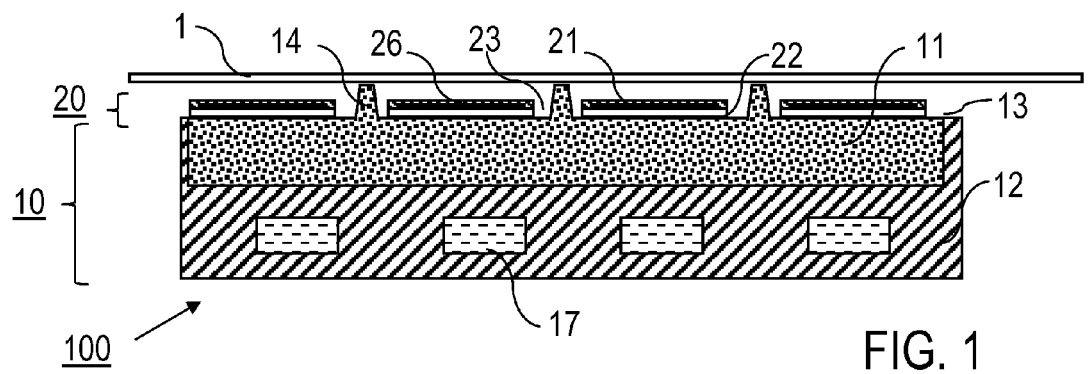
FIG. 1: is a schematic sectional view of a first embodiment of the electrostatic holding apparatus according to the invention.

FIG. 1 shows a schematic sectional view of a preferred embodiment of the electrostatic holding apparatus 100 according to the invention when used in semiconductor processing. The holding apparatus 100 comprises a base body 10 having a stack structure, comprising a first plate 11 and a second plate 12. The first plate 11 is made of SiSiC, for example. For a monopolar holding apparatus, the first plate 11 has, for example, a circular shape with a diameter of 30 cm and a thickness of 5 mm. The second plate 12 is made of $Si_3N_4$, for example, with a thickness of from 5 mm to 10 mm. Temperature adjustment medium lines 17 which are coupled with a temperature adjustment device (not shown) are embedded in the second plate 12. By means of the temperature adjustment device, a temperature adjustment medium circuit is formed, by means of which the temperature of the holding apparatus 100 can be adjusted. The first plate 11 is connected to the second plate 12. The second plate 12 has on its upper side a recess into which the first plate 11 is set.

The first plate 11 has on the upper side 13 of the base body 10 projecting upper burls 14, which span a support surface for a silicon wafer 1. The burls 14 have, for example, the form of cuboids, cylinders, pyramids, cones, truncated pyramids and/or truncated cones, preferably with a height of from 5 μm to 25 μm, a diameter of from 20 μm to 100 μm and a mutual gap of 1 mm.

The first plate 11 is electrically conductive. For receiving a voltage, the first plate 11 is equipped with a contact region (not shown) which is configured for electrical connection to a voltage source. The contact region comprises, for example, a blind bore in the first plate 11, which blind bore has a diameter of 0.5 mm, for example, and is designed as a fit. A metal sleeve, for example of gold, which receives a line for connection to the voltage source, is fitted into the bore.

The holding apparatus 100 further comprises an electrode device 20 having a plurality of layer-type electrodes 21 which are arranged on a carrier disk 22 of silicon. The carrier disk 22 is a silicon wafer having a thickness of 300 μm, for example, which extends on the upper side of the base body 10 and has holes 23 for receiving the burls 14. The inner diameter of the holes 23 is greater than the cross-sectional dimension, for example the outside diameter, of the burls 14, so that the carrier disk 22 is spaced apart from the burls 14. Gaps are formed between the burls 14 and the carrier disk 22, which gaps advantageously form pockets for receiving unwanted particles. The particles are able to collect in the pockets without interfering with the planarity of the bearing contact of the component 1 on the burls 14.

On the surface of the carrier disk 22 there is provided a first insulating layer 25 (see FIG. 2) which is formed by a natural oxide of the silicon material of the carrier disk 22. The entire carrier disk, including the electrodes 21, is further covered with a second insulating layer 26 which is likewise formed of $SiO_2$.

Figure 2:
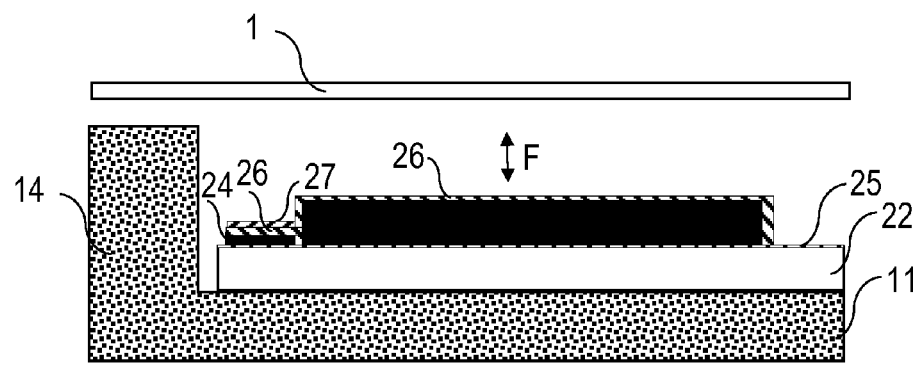
FIG. 2: is a schematic sectional view of a carrier element on the upper side of a holding apparatus according to the invention.

FIG. 2 shows an enlarged sectional view of a portion of a holding apparatus 100 according to the invention with the first plate 11, a projecting burl 14, the carrier disk 22 and the electrode 21. The electrode 21 is arranged on the first insulating layer 25 and connected to a voltage source (see FIG. 3) via a conductor strip 24. The first electrode 21 and the conductor strip 24 are covered with a second insulating layer 26 in order to avoid undesirable short circuits. FIG. 2 illustrates a particular advantage of the invention: the gap between the burl 14 and the electrode 21 serves as a particle trap. The gap can even be increased purposively in dependence on the specific application in order to enhance the action as a particle trap. Furthermore, the gap between the electrode and the wafer can be smaller, also because a coating can be used here.

When the electrode 21 receives a clamping voltage, a holding force F is exerted in the portions between the burls 14, so that the silicon wafer 1 to be held is attracted to the holding apparatus 100. In order to avoid electrostatic effects of the conductor strip 24, it is preferably covered with a conducting coating 27 which is at the same potential as the silicon wafer 1, in particular at ground potential.

The holding apparatus 100 is produced by prefabricating the base body 10 and the electrode device 20 individually as separate modules. In order to produce the base body 10, the first and second plates 11, 12 are formed individually and connected together by high-temperature soldering. The electrode device 20 is produced by providing a silicon wafer having an oxidized surface with the holes 23, for example by anisotropic etching or boring. The electrodes 21 are then deposited on the disk portions between the holes 23, for example by locally selective vapor deposition of polysilicon, gold or aluminum using masks. Alternatively, the electrodes can be formed first, followed by formation of the holes between the electrodes. Finally, the second insulating layer 26 is applied, for example by sputtering.

The electrode device 20 is placed on the base body 10 so that the burls project through the carrier disk without touching it. The base body 10 and the electrode device 20 are then connected together, for example by adhesive bonding or eutectic bonding.

Figure 3:
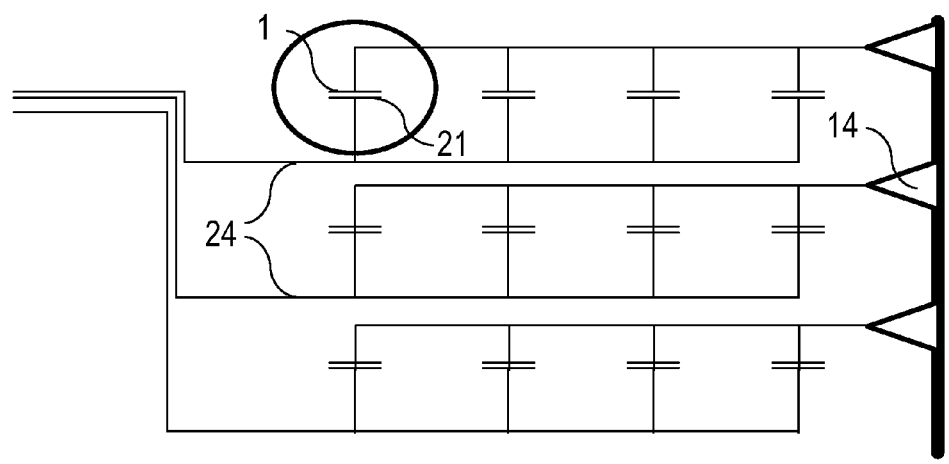
FIG. 3: is a schematic view of the electrical connection of the electrodes to a voltage source via conductor strips.

FIG. 3 illustrates in a schematic plan view the electrical connection of the electrodes 21 to a voltage source 30 via the conductor strips 24. The electrodes 21 are connected together in groups, for example, in each case via a common conductor strip 24. The respective counter-electrode is formed by the silicon wafer 1, which is connected with ground potential via the burls 14 shown schematically in the right-hand part of FIG. 3. Alternatively, each electrode 21 can be connected to the voltage source 30 via an associated conductor strip 24, in order selectively to receive a predetermined clamping voltage. This advantageously allows each individual electrode to be controlled separately, for example in order to be able purposively to adjust the planarity of the silicon wafer 1.

The first plate 11 of SiSiC is, for example, at the middle voltage of the electrodes used (e.g. 0 V at ±1000 V). Alternatively, a substantially different voltage value can also be provided: for example, the first plate 11 could be at 10 kV and the clamping electrodes at 9000 V or 11,000 V. The structure shown here has the particular advantage that the first plate 11 of SiSiC is embedded in an insulating body, as a result of which it is possible to apply specific bias voltages.

The features of the invention disclosed in the preceding description, the drawings and the claims can be of significance, both singly or in combination, for the implementation of the invention in its various embodiments.

What is claimed is:

1. A holding apparatus configured to electrostatically hold a component, comprising:
    a base body which comprises at least one plate,
    a plurality of projecting burls which are arranged on an upper side of the base body and form a support for the component, and
    an electrode device having a plurality of electrodes which are arranged on the upper side of the base body in gaps between the burls, wherein
    the electrode device comprises a silicon carrier disk having a plurality of holes,
    the carrier disk and the base body are separate modules with the carrier disk bonded to the upper side of the base body in such a manner that the burls project through the holes and are spaced apart from the carrier disk, and
    the electrodes are arranged on disk portions between the holes.

2. The holding apparatus according to claim 1, wherein the electrode device comprises conductor strips which are arranged on the carrier disk for connecting the electrodes to a voltage source.

3. The holding apparatus according to claim 2, wherein the strip conductors and the voltage source are configured such that at least one of the electrodes can selectively receive a specific clamping voltage.

4. The holding apparatus according to claim 1, wherein the base body comprises a first plate of SiSiC or SSiC ceramic and a second plate of $Si_3N_4$ or SiC ceramic or of borosilicate glass.

5. The holding apparatus according to claim 4, wherein the second plate has on a side facing the upper side of the base body a recess into which the first plate is set.

6. The holding apparatus according to claim 1, wherein the electrode device comprises at least one of
    a first insulating layer which is arranged between the carrier disk and the electrode, and
    a second insulating layer which covers the carrier disk with the electrodes.

7. The holding apparatus according to claim 1, including at least one of the features
    the electrodes are made of polysilicon or titanium nitride, and
    the burls are integrally connected to the base body.

8. A method for producing a holding apparatus according to claim 1, comprising the steps:

producing a base body comprising at least one plate and a plurality of projecting burls which are arranged on an upper side of the base body and form a support for the component, and producing an electrode device comprising a plurality of electrodes which are arranged on the upper side of the base body in gaps between the burls, wherein the production of the electrode device comprises the steps producing a carrier disk of silicon having a plurality of holes and having a plurality of electrodes on disk portions between the holes of the carrier disk, placing the carrier disk on the upper side of the base body in such a manner that the burls project through the holes and are spaced apart from the carrier disk, and connecting the carrier disk and the base body.

9. The method according to claim 8, wherein
the step of connecting the carrier disk and the base body comprises adhesive bonding or eutectic bonding.

10. The method according to claim 8, wherein the carrier disk consists of silicon.

11. The method according to claim 8, wherein the carrier disk consists of crystalline silicon.

12. The holding apparatus according to claim 1, wherein the carrier disk consists of silicon.

13. The holding apparatus according to claim 1, wherein the carrier disk consists of crystalline silicon.

\* \* \* \* \*